(12) United States Patent
Toyokura

(10) Patent No.: US 6,501,398 B2
(45) Date of Patent: Dec. 31, 2002

(54) VARIABLE-LENGTH CODE DECODER USING BARREL SHIFTERS AND A LOOK-UP TABLE

(75) Inventor: Masaki Toyokura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/815,269

(22) Filed: Mar. 23, 2001

(65) Prior Publication Data
US 2001/0026230 A1 Oct. 4, 2001

(30) Foreign Application Priority Data

Mar. 24, 2000 (JP) .......................................... 2000-084343

(51) Int. Cl.[7] .............................. H03M 7/00; H03M 7/40
(52) U.S. Cl. ......................................... 341/67; 341/106
(58) Field of Search .............................. 341/67, 50, 65, 341/106; 382/232, 246; 708/209; 375/240, 340

(56) References Cited

U.S. PATENT DOCUMENTS

| 5,245,338 A | | 9/1993 | Sun ............................ 341/67 |
| 5,557,271 A | * | 9/1996 | Rim et al. ..................... 341/67 |
| 5,646,873 A | * | 7/1997 | Shimazawa et al. ........ 708/209 |
| 5,652,583 A | * | 7/1997 | Kang ........................... 341/67 |
| 5,663,726 A | * | 9/1997 | Bakhmutsky ................ 341/67 |
| 5,867,113 A | * | 2/1999 | Sano et al. ................... 341/67 |
| 6,011,498 A | * | 1/2000 | Wittig .......................... 341/67 |
| 6,215,424 B1 | * | 4/2001 | Cooper ........................ 341/67 |

* cited by examiner

*Primary Examiner*—Patrick Wamsley
(74) *Attorney, Agent, or Firm*—McDermott, Will & Emery

(57) ABSTRACT

A variable-length code decoder sequentially decodes a series of variable-length codewords included in a bit stream and outputs decoded symbols corresponding to the codewords. The decoder includes an interface section and a decoding section. The interface section accumulates various code lengths of the decoded codewords to obtain a sum. Next, the interface section selects an N-bit contiguous data sequence (where N is a maximum code length of the codewords) from a 2N- or (2N−1)-bit contiguous data sequence, included in the bit stream, in accordance with the sum and outputs the N-bit contiguous data sequence. The decoding section receives the output of the interface section and decodes a codeword included in a combination of the output and a previous output of the interface section by reference to a lookup table, thereby obtaining and outputting a decoded symbol and outputting a code length of the decoded codeword to the interface section.

12 Claims, 10 Drawing Sheets

| a1-a8 | b1-b6 | c1-c5 | d1-d15 | e1-e12 | f1-f10 | g1-g9 | h1-h16 | ... |

FIG. 3

| CYCLE | BARREL SHIFTER REGISTER 122 | INPUT REGISTER 112 | OUTPUT OF BUFFER 101 | SHIFT LENGTH OF BARREL SHIFTER 121 | SHIFT LENGTH OF BARREL SHIFTER 111 | CARRY SIGNAL CR |
|---|---|---|---|---|---|---|
| 0 | x | x | a1-a8b1-b6c1-c2 | 16 | 16 | 1 |
| 1 | a1-a8b1-b6c1-c2 | a1-a8b1-b6c1-c2 | c3-c5d1-d13 | 8 | 16 | 1 |
| 2 | b1-b6c1-c5d1-d5 | c3-c5d1-d13 | d14-d15e1-e12f1-f2 | 6 | 8 | 0 |
| 3 | c1-c5d1-d11 | c3-c5d1-d13 | d14-d15e1-e12f1-f2 | 5 | 14 | 1 |
| 4 | d1-d15e1 | d14-d15e1-e12f1-f2 | f3-f10g1-g8 | 15 | 3 | 1 |
| 5 | e1-e12f1-f4 | f3-f10g1-g8 | g9h1-h15 | 12 | 2 | 0 |
| 6 | f1-f10g1-g6 | f3-f10g1-g8 | g9h1-h15 | 10 | 14 | 1 |
| 7 | g1-g9h1-h7 | g9h1-h15 | h16··· | 9 | 8 | 1 |
| 8 | h1-h16 | h16··· | ··· | 16 | 1 | 1 |

| CYCLE | OUTPUT OF BARREL SHIFTER 121 | OUTPUT OF BARREL SHIFTER 111 | DECODED SYMBOL DC | CODE LENGTH CL |
|---|---|---|---|---|
| 0 | a1-a8b1-b6c1-c2 | a1-a8b1-b6c1-c2 | x | x |
| 1 | b1-b6c1-c5d1-d5 | c3-c5d1-d13 | A | 8 |
| 2 | c1-c5d1-d11 | d6-d15e1-e6 | B | 6 |
| 3 | d1-d15e1 | d12-d15e1-e12 | C | 5 |
| 4 | e1-e12f1-f4 | e2-e12f1-f5 | D | 15 |
| 5 | f1-f10g1-g6 | f5-f10g1-g9h1 | E | 12 |
| 6 | g1-g9h1-h7 | g7-g9h1-h13 | F | 10 |
| 7 | h1-h16 | h8-h16··· | G | 9 |
| 8 | ··· | ··· | H | 16 |

FIG. 7

| CYCLE | BARREL SHIFTER REGISTER 223 | BARREL SHIFTER REGISTER 222 | INPUT REGISTER 112 | OUTPUT OF BUFFER 101 | SHIFT LENGTH OF BARREL SHIFTER 221 | SHIFT LENGTH OF BARREL SHIFTER 111 | CARRY SIGNAL CR |
|---|---|---|---|---|---|---|---|
| 0 | x | x | x | a1-a8b1-b6c1-c2 | x | 16 | 1 |
| 1 | x | a1-a8b1-b6c1-c2 | a1-a8b1-b6c1-c2 | c3-c5d1-d13 | 16 | 16 | 1 |
| 2 | a1-a8b1-b6c1-c2 | c3-c5d1-d13 | c3-c5d1-d13 | d14-d15e1-e12f1-f2 | 8 | 8 | 0 |
| 3 | b1-b6c1-c5d1-d5 | d6-d15e1-e6 | c3-c5d1-d13 | d14-d15e1-e12f1-f2 | 6 | 14 | 1 |
| 4 | c1-c5d1-d11 | d12-d15e1-e12 | d14-d15e1-e12f1-f2 | f3-f10g1-g8 | 5 | 3 | 1 |
| 5 | d1-d15e1 | e2-e12f1-f5 | f3-f10g1-g8 | g9h1-h15 | 15 | 2 | 0 |
| 6 | e1-e12f1-f4 | f5-f10g1-g8 | f3-f10g1-g8 | g9h1-h15 | 12 | 14 | 1 |
| 7 | f1-f10g1-g6 | g7-g9h1-h13 | g9h1-h15 | h16··· | 10 | 8 | 1 |
| 8 | g1-g9h1-h7 | h8-h16··· | h16··· | ··· | 9 | 1 | 1 |

| CYCLE | OUTPUT OF BARREL SHIFTER 221 | OUTPUT OF BARREL SHIFTER 111 | DECODED SYMBOL DC | CODE LENGTH CL |
|---|---|---|---|---|
| 0 | x | a1-a8b1-b6c1-c2 | x | x |
| 1 | a1-a8b1-b6c1-c2 | c3-c5d1-d13 | A | 8 |
| 2 | b1-b6c1-c5d1-d5 | d6-d15e1-e6 | B | 6 |
| 3 | c1-c5d1-d11 | d12-d15e1-e12 | C | 5 |
| 4 | d1-d15e1 | e2-e12f1-f5 | D | 15 |
| 5 | e1-e12f1-f4 | f5-f10g1-g8 | E | 12 |
| 6 | f1-f10g1-g6 | g7-g9h1-h13 | F | 10 |
| 7 | g1-g9h1-h7 | h8-h16··· | G | 9 |
| 8 | h1-h16 | ··· | H | 16 |

FIG. 12

| CYCLE | INPUT REGISTER 913 | INPUT REGISTER 912 | OUTPUT OF BUFFER 901 | READ SIGNAL RD | SHIFT LENGTH OF BARREL SHIFTER 921 | SHIFT LENGTH OF BARREL SHIFTER 911 | CARRY SIGNAL CR |
|---|---|---|---|---|---|---|---|
| 0 | x | x | a1-a8b1-b6c1-c2 | 1 | 16 | 16 | 1 |
| 1 | x | a1-a8b1-b6c1-c2 | c3-c5d1-d13 | 1 | 16 | 16 | 1 |
| 2 | a1-a8b1-b6c1-c2 | c3-c5d1-d13 | d14-d15e1-e12f1-f2 | 1 | 16 | 16 | 1 |
| 3 | c3-c5d1-d13 | d14-d15e1-e12f1-f2 | f3-f10g1-g8 | 0 | 8 | 8 | 0 |
| 4 | c3-c5d1-d13 | d14-d15e1-e12f1-f2 | f3-f10g1-g8 | 0 | 6 | 14 | 0 |
| 5 | c3-c5d1-d13 | d14-d15e1-e12f1-f2 | f3-f10g1-g8 | 1 | 5 | 19 | 1 |
| 6 | d14-d15e1-e12f1-f2 | f3-f10g1-g8 | g9h1-h15 | 1 | 15 | 18 | 1 |
| 7 | f3-f10g1-g8 | g9h1-h15 | h16... | 1 | 12 | 14 | 0 |
| 8 | f3-f10g1-g8 | g9h1-h15 | h16... | 0 | 10 | 24 | 1 |
| 9 | ... | ... | ... | 1 | 9 | 17 | 1 |

| CYCLE | BARREL SHIFTER REGISTER 923 | BARREL SHIFTER REGISTER 922 | OUTPUT OF BARREL SHIFTER 921 | OUTPUT OF BARREL SHIFTER 911 | DECODED SYMBOL DC | CODE LENGTH CL |
|---|---|---|---|---|---|---|
| 0 | x | x | x | x | x | x |
| 1 | x | x | a1-a8b1-b6c1-c2 | a1-a8b1-b6c1-c2 | x | x |
| 2 | x | a1-a8b1-b6c1-c2 | c3-c5d1-d13 | c3-c5d1-d13 | A | 8 |
| 3 | a1-a8b1-b6c1-c2 | c3-c5d1-d13 | d6-d15e1-e6 | d6-d15e1-e6 | B | 6 |
| 4 | b1-b6c1-c5d1-d5 | d6-d15e1-e6 | d12-d15e1-e12 | d12-d15e1-e12 | C | 5 |
| 5 | c1-c5d1-d11 | d12-d15e1-e12 | e2-e12f1-f5 | e2-e12f1-f5 | D | 15 |
| 6 | d1-d15e1 | e2-e12f1-f5 | f5-f10g1-g9h1 | f5-f10g1-g9h1 | E | 12 |
| 7 | e1-e12f1-f4 | f5-f10g1-g8 | g7-g9h1-h13 | g7-g9h1-h13 | F | 10 |
| 8 | f1-f10g1-g6 | g7-g9h1-h13 | h8-h16... | h8-h16... | G | 9 |
| 9 | g1-g9h1-h7 | h8-h16... | ... | ... | H | 16 |

VARIABLE-LENGTH CODE DECODER USING BARREL SHIFTERS AND A LOOK-UP TABLE

BACKGROUND OF THE INVENTION

The present invention relates to a variable-length code (VLC) decoder.

In order to reduce the bandwidth of a communication means or the capacity of a storage medium in transmitting or recording a moving picture, the picture is compressed and encoded. International standards for moving picture encoding include H.261, MPEG (moving picture experts group) 1, MPEG2, and so on.

These encoding methods are combinations of motion vector estimation and motion compensation, DCT (discrete cosine transform), quantization, zigzag scanning, variable-length coding, etc. Variable-length coding is an encoding method for reducing the average number of bits by converting quantized fixed-length codewords into a bit stream of variable-length codewords according to their statistics. To decode such a bit stream and present moving pictures, it is necessary to perform variable-length code (VLC) decoding for converting the variable-length codewords into the original fixed-length data. In VLC decoding, the codewords have non-constant lengths, and it is not possible to identify the first bit position of each variable-length codeword in the bit stream. Therefore, the codewords need to be decoded according to the order of bits included in the bit stream.

Various VLC decoders have been proposed in the art to realize a high-speed VLC decoding operation. A known VLC decoder is disclosed in U.S. Pat. No. 5,245,338. FIG. 11 is a block diagram illustrating a VLC decoder of this type. The VLC decoder shown in FIG. 11 decodes variable-length codewords with a maximum code length of 16 bits.

A buffer 901 stores an input bit stream. If a read signal RD is "1", the buffer 901 outputs the stored bit stream to a first barrel shifter 911 and a first input register 912 on a 16-bit basis in the next cycle. The buffer 901 holds the output for one cycle.

The first and second input registers 912 and 913 have a 16-bit configuration, and latch the input data in the next cycle if an update signal is "1".

The first barrel shifter 911 combines the outputs of the second and first input registers 913 and 912 and the output of the buffer 901 with each other as the upper, middle and lower 16-bit sub-sequences, respectively, to obtain a 48-bit data sequence. Then, using a sum SM (from 0 through 31), i.e., the output of an adder 914, as a shift length (from 1 through 32), the first barrel shifter 911 selects 16 bits from the 48-bit combined data sequence and then writes the 16-bit data sequence on a first barrel shifter register 922. The 16 bits selected are the (shift length+1)$^{th}$ through (shift length+16) bits of the 48-bit data sequence as counted from the most significant bit (MSB) thereof. It should be noted that the "first bit" herein means the MSB of the 48-bit combined data sequence.

A second barrel shifter 921 combines the outputs of second and first barrel shifter registers 923 and 922 with each other as the upper and lower 16-bit sub-sequences, respectively, to obtain a 32-bit data sequence. Then, using the output of a shift length register 925 as a shift length (from 1 through 16), the second barrel shifter 921 selects 16 bits from the 32-bit combined data sequence and then writes the 16-bit data sequence on the second barrel shifter register 923. The 16 bits selected are the (shift length+1)$^{th}$ through (shift length+16)$^{th}$ bits of the 32-bit data sequence as counted from the MSB thereof.

A lookup table (LUT) 924 performs variable-length code decoding on the output of the second barrel shifter 921 to obtain a decoded symbol DC and a code length CL (from 1 through 16), and then writes the code length CL on the shift length register 925. The LUT 924 is a table so compiled as to output a decoded symbol and a code length for each codeword with any of various lengths. The LUT 924 receives each codeword with the first bit thereof regarded as the MSB thereof.

The adder 914 adds together the output of the shift length register 925 (from 1 through 16) and the output of an accumulation register 915 (from 0 through 15) to output the sum SM. The adder 914 writes a carry signal CR, which is "1" if the sum SM is 16 to 31, on a hold register 916 and writes a remainder RM (from 0 through 15) of the sum SM modulo 16 on the accumulation register 915. Thus, the MSB of the 5-bit sum SM, obtained by adding together the 5-bit output of the shift length register 925 and the 4-bit output of the accumulation register 915, is the carry signal CR, while the remaining 4 bits thereof is the remainder RM of the sum SM modulo 16. The carry signal CR is used as an update signal for the first and second input registers 912 and 913, and the read signal RD, i.e., the output of the hold register 916, is used as a read signal for the buffer 901.

FIG. 12 illustrates exemplary cycle-by-cycle data flows in the VLC decoder shown in FIG. 11. For example, "a1–a8" denotes an 8-bit data sequence consisting of a1, a2, a3, a4, a5, a6, a7 and a8. For example, "a1–a8b1–b6c1–c2" for the buffer output in cycle 0 denotes a 16-bit data sequence consisting of a1 through a8, b1 through b6 and c1 through c2.

In FIG. 12, as for cycle 0 to cycle 2, the update and read signals and shift lengths for the first and second barrel shifters are "1", "1", "16" and "16", respectively, to set initial-state data for the respective registers. From cycle 3 on, the same processing is repeatedly performed based on the respective values of the carry and read signals, the accumulation register and the shift length register.

In this manner, a decoded symbol is obtained every cycle. At the beginning of the decoding operation, the first decoded output is obtained in cycle 2, i.e., two cycles later than cycle 0 at which the input buffer 901 outputs data for the first time.

However, the known VLC decoder as illustrated in FIG. 11 needs two input registers and a 48-bit-input, 16-bit-output circuit as the first barrel shifter. Thus, the decoder must be implemented at a large circuit size, and occupies an excessively broad chip area when realized as an LSI.

In addition, when the conventional VLC decoder illustrated in FIG. 11 starts its decoding operation, it is not until two cycles have passed after the input buffer has supplied its first output that a first decoded codeword is obtained. If multiple streams of variable-length codewords are included in a single bit stream, information other than the variable-length code, such as headers, is included between the variable-length codeword streams. In such a case, the variable-length codeword streams are not contiguous with each other, and the VLC decoding cannot be performed continuously. Thus, if the VLC decoding cannot be performed consecutively, the 2-cycle delay occurs every time a variable-length codeword stream starts to be decoded. As a result, it takes a huge number of cycles to decode the entire bit stream.

SUMMARY OF THE INVENTION

It is therefore an object of the present invention to implement a variable-length code decoder at a reduced circuit size so that the decoder occupies a smaller chip area and supplies its decoded output at a much smaller delay.

Specifically, an inventive variable-length code decoder sequentially decodes a series of variable-length codewords included in a bit stream and outputs decoded symbols corresponding to the codewords. The decoder includes an interface section and a decoding section. The interface section accumutates various code lengths of the decoded codewords to obtain a sum. In accordance with the sum, the interface section selects a contiguous data sequence having a length of N bits (where N is a maximum code length of the variable-length codewords) from another contiguous data sequence, which has a length of 2N or 2N−1 bits and included in the bit stream, and outputs the N-bit contiguous data sequence. The decoding section receives the output of the interface section and decodes a codeword, included in a combination of the output and a previous output of the interface section, by reference to a lookup table, thereby obtaining and outputting a decoded symbol and also outputting a code length of the decoded codeword to the interface section.

According to this invention, the decoder is implementable in a smaller circuit size, because the interface section selects an N-bit contiguous data sequence, needed for the decoding section, from a 2N- or (2N−1)-bit contiguous data sequence included in the bit stream.

In one embodiment of the present invention, the interface section may include accumulation register, adder, input register and barrel shifter. The accumulation register stores and outputs a remainder derived from the sum. The adder adds together the code length and the remainder, which have been output from the decoding section and the accumulation register, respectively, to obtain the sum. Then, the adder outputs a quotient and a remainder, which are obtained by dividing the sum by N, as a carry signal and a new remainder, respectively. The input register stores and outputs a contiguous data sequence, which has a length of N or N−1 bits and is included in the bit stream, if the carry signal is one. The barrel shifter combines the output of the input register with the following N-bit contiguous data sequence, which is included in the bit stream, so that the bits are arranged in the same order as in the bit stream. Next, the barrel shifter selects an N-bit contiguous data sequence from the combined data sequence using the remainder, output from the accumulation register, as a shift input value, and then outputs the N-bit contiguous data sequence selected to the decoding section. The N-bit contiguous data sequence selected starts from a bit position that has been determined in accordance with the shift input value.

According to this embodiment, the carry signal is used for updating the data stored on the input register, and the remainder of the sum is written on the accumulation register. Accordingly, the remainder will be used as a shift length for the barrel shifter one cycle later. Thus, even if the sum of code lengths exceeds the maximum code length so that a shift operation should be performed at a shift length exceeding the maximum code length, the barrel shifter may perform a shift operation at a small shift length. This is because by updating the input register, after the barrel shifter has performed a first shift operation at the shift length equal to the maximum code length, the shifter may perform another shift operation at the remaining shift length in the next cycle. Therefore, the bit width of the barrel shifter can be reduced. Moreover, since only one input register is required, only one cycle is needed for initialization.

In this particular embodiment, the barrel shifter preferably selects and outputs the N-bit contiguous data sequence, which starts from an $(M+2)^{th}$ bit (where M is the shift input value) of the combined data sequence as counted from the first bit thereof.

According to this embodiment, the interface section can select and output the N-bit contiguous data sequence, needed for the decoding section, in accordance with the shift input value.

In another embodiment of the present invention, the decoding section may includes barrel shifter, barrel shifter register and lookup table. The barrel shifter combines outputs of the barrel shifter register and the interface section so that the bits are arranged in the same order as in the bit stream. Next, the barrel shifter selects an N-bit contiguous data sequence from the combined output using the code length, output from the lookup table, as a shift input value, and then outputs the N-bit contiguous data sequence selected. The N-bit contiguous data sequence selected starts from a bit position that has been determined in accordance with the shift input value. The barrel shifter register stores and outputs the output of the barrel shifter. And the lookup table outputs the symbol, corresponding to the codeword included in the output of the barrel shifter register, and outputs the code length of the decoded codeword.

According to such an embodiment, the output of the interface section is directly input to the barrel shifter of the decoding section, and the output of the barrel shifter is written on the barrel shifter register. Accordingly, the decoder may have a reduced number of barrel shifter registers.

In this particular embodiment, the barrel shifter preferably selects and outputs the N-bit contiguous data sequence, which starts from an $(L+1)^{th}$ bit (where L is the shift input value) of the combined output as counted from the first bit thereof.

According to this embodiment, an N-bit contiguous data sequence, beginning with a codeword to be decoded next, can be input to the lookup table.

In still another embodiment, the decoding section may further include a code length converter for outputting a value obtained by subtracting one from the code length. The barrel shifter may select and output the N-bit contiguous data sequence, which starts from an $(L+2)^{th}$ bit of the combined output as counted from the first bit thereof, by using not the code length but the output of the code length converter as the shift input value.

According to this embodiment, the range of shift input values for the barrel shifter can be narrowed. Particularly, if the maximum code length is an $n^{th}$ power of two, the number of bits representing the shift input value decreases. Thus, the shift input for the barrel shifter can have a smaller bit width.

In yet another embodiment, the decoding section may include barrel shifter, first and second barrel shifter registers, lookup table and shift length register. The barrel shifter combines outputs of the first and second barrel shifter registers with each other so that the bits are arranged in the same order as in the bit stream. Next, the barrel shifter selects an N-bit contiguous data sequence from the combined output using a value, derived from an output of the shift length register, as a shift input value, and then outputs the N-bit contiguous data sequence selected. The N-bit contiguous data sequence selected starts from a bit position that has been determined in accordance with the shift input value. The first barrel shifter register stores and outputs the output of the interface section. The second barrel shifter register stores and outputs the output of the barrel shifter. The lookup table outputs the decoded symbol, corresponding to the codeword included in the output of the barrel shifter, and outputs the code length of the decoded codeword. And the shift length register stores and outputs a value corresponding to the code length.

According to this embodiment, an N-bit contiguous data sequence, including a variable-length codeword to be decoded, can be selected from the output of the interface section, and then decoded sequentially.

In this particular embodiment, the shift length register preferably stores and outputs the code length. The barrel shifter preferably selects and outputs the N-bit contiguous data sequence, which starts from an $(L+1)^{th}$ bit of the combined output as counted from the first bit thereof, by using the output of the shift length register as the shift input value.

According to this embodiment, an N-bit contiguous data sequence, beginning with a codeword to be decoded next, can be input to the lookup table.

In an alternative embodiment, the decoding section may further include a code length converter for outputting a value obtained by subtracting one from the code length. The barrel shifter may select and output the N-bit contiguous data sequence, which starts from an $(L+2)^{th}$ bit of the combined output as counted from the first bit thereof, by using the code-length-minus-one value, which has been input thereto by way of the code length converter and the shift length register, as the shift input value.

According to this embodiment, the range of shift input values for the barrel shifter can be narrowed. Particularly, if the maximum code length is an $n^{th}$ power of two, the number of bits representing the shift input value decreases. Thus, the shift input for the barrel shifter can have a smaller bit width.

In still another embodiment, the inventive variable-length code decoder may include, in combination: the interface section including the accumulation register, adder, input register and barrel shifter; and the decoding section including the barrel shifter, barrel shifter register and lookup table.

According to such an embodiment, the output of the barrel shifter of the interface section is directly input to the barrel shifter of the decoding section, and the output of the latter barrel shifter is written on the barrel shifter register. Accordingly, the decoder may have a reduced number of barrel shifter registers.

In an alternative embodiment, the inventive variable-length code decoder may include, in combination: the interface section including the accumulation register, adder, input register and barrel shifter; and the decoding section including the barrel shifter, first and second barrel shifter registers, lookup table and shift length register.

According to this embodiment, an N-bit contiguous data sequence, including a variable-length codeword to be decoded, can be selected from the output of the barrel shifter of the interface section, and then decoded sequentially.

In the decoder according to one of these two embodiments, the adder preferably obtains the sum by adding one to the sum of the code length and the remainder that have been output from the decoding section and the accumulation register, respectively. And the lookup table preferably outputs, as the code length, a value obtained by subtracting one from the code length of the codeword.

According to this embodiment, the range of shift input values for the barrel shifter can be narrowed. Particularly, if the maximum code length is an $n^{th}$ power of two, the number of bits representing the shift input value decreases. Thus, the shift input for the barrel shifter can have a smaller bit width. Also, there is no need to provide any code length converter.

BRIEF DESCRIPTION OF THE DRAWINGS

FIG. 3 illustrates exemplary cycle-by-cycle data flows in the VLC decoder shown in FIG. 1.

FIG. 7 illustrates exemplary cycle-by-cycle data flows in the VLC decoder shown in FIG. 6.

FIG. 12 illustrates exemplary cycle-by-cycle data flows in the VLC decoder shown in FIG. 11.

DESCRIPTION OF THE PREFERRED EMBODIMENTS

Hereinafter, embodiments of the present invention will now be described with reference to the accompanying drawings.

Embodiment 1

Figures 1, 2:
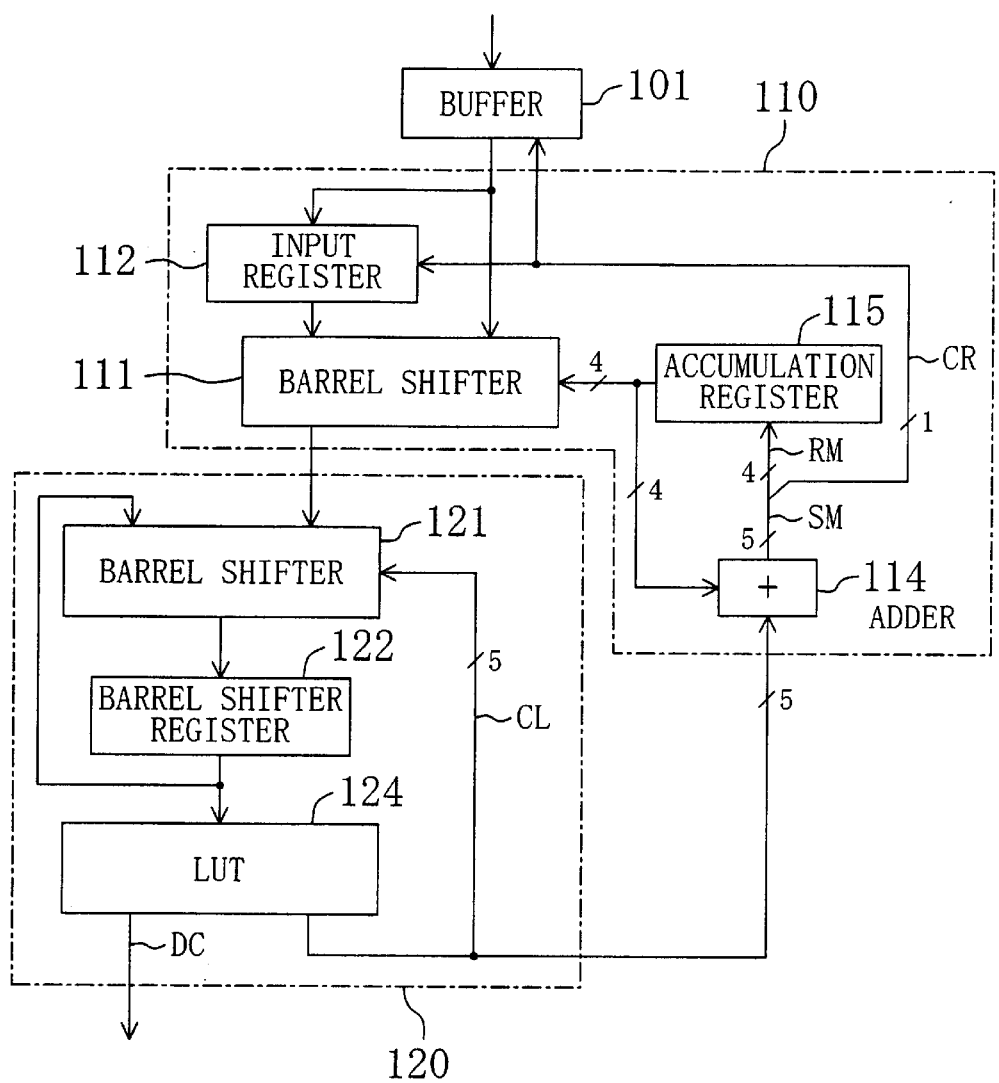
FIG. 1 is a block diagram illustrating a VLC decoder according to a first embodiment of the present invention.
FIG. 2 illustrates an exemplary input bit stream.

FIG. 1 is a block diagram illustrating a VLC decoder according to a first embodiment of the present invention. In the following illustrative embodiment, the decoder decodes variable-length codewords with a maximum code length N of 16 bits. The decoder shown in FIG. 1 includes an interface section 110 and a decoding section 120. The interface section 110 includes barrel shifter 111, input register 112, adder 114 and accumulation register 115. The decoding section 120 includes barrel shifter 121, barrel shifter register 122 and lookup table (LUT) 124.

FIG. 2 illustrates an exemplary input bit stream. In FIG. 2, "a1" and so on denote 1-bit data. For example, "a1–a8" denotes an 8-bit data sequence consisting of a1, a2, a3, a4, a5, a6, a7 and a8. Also, 8-bit data sequence "a1–a8", 6-bit data sequence "b1–b6", 5-bit data sequence "c1–c5" and 15-bit data sequence "d1–d15" are variable-length codewords corresponding to data "A", "B", "C" and "D", respectively. Similarly, 12-bit data sequence "e1–e12", 10-bit data sequence "f1–f10", 9-bit data sequence "g1–g9" and 16-bit data sequence "h1–h16" are variable-length codewords corresponding to data "E", "F", "G" and "H", respectively.

In the following illustrative embodiment, an input bit stream consists of a series of variable-length codewords that have a maximum code length of 16 bits and correspond to the data "A" to data "H", respectively, as illustrated in FIG. 2. Also, "a1–a8b1–b6c1–c2", for example, denotes a 16-bit data sequence consisting of a1 through a8, b1 through b6, c1 and c2.

As shown in FIG. 1, a bit stream and a carry signal CR, which is output from the adder 114, are input to a buffer 101. The input register 112 accommodates a data sequence of 16 bits corresponding to the maximum code length, and latches the 16-bit input data, output from the buffer 101, in the next cycle if the carry signal CR is "1".

The buffer 101 stores the input bit stream thereon and outputs the stored bit stream to the barrel shifter 111 and the input register 112 on a 16-bit basis in the next cycle if the carry signal CR is "1". The buffer 101 holds its output for one cycle.

The remainder RM (from 0 through 15; which indicates a possible value of the remainder RM; this notation applies to the remaining description), output from the accumulation register 115, is input to the barrel shifter 111 as a shift input value. The barrel shifter 111 combines the outputs of the input register 112 and buffer 101 with each other as the upper and lower 16-bit sub-sequences, respectively, to obtain a 32-bit data sequence. Then, using the sum of the shift input value and one as a shift length SH1 (from 1 through 16), the barrel shifter 111 selects 16 bits from the 32-bit combined data sequence and then outputs the 16-bit data sequence to the barrel shifter 121. The 16 bits selected are the $(SH1+1)^{th}$ through $(SH1+16)^{th}$ bits of the 32-bit data sequence. It should be noted that the "first bit" herein means the MSB of the 32-bit combined data sequence. Accordingly, the barrel shifter 111 selects a contiguous data sequence with a length of 16 bits (=N bits) from another contiguous data sequence with a length of 32bits (=2N bits) in a bit stream so that the 16-bit data sequence selected starts from an $(M+2)^{th}$ bit position as determined in accordance with the shift input value M.

The barrel shifter register 122 accommodates a data sequence of 16 bits corresponding to the maximum code length, and outputs the data stored to the barrel shifter 121 and LUT 124.

The LUT 124 decodes the output of the barrel shifter register 122, thereby outputting a decoded symbol DC and the code length CL (from 1 through 16) of the decoded codeword to the barrel shifter 121 and adder 114. The LUT 124 receives the first bit of a codeword as the MSB. The LUT 124 is a table so compiled as to store decoded symbols and code lengths for respective variable-length codewords. Starting at the MSB, the LUT 124 compares an input codeword to each of those codewords on a bit-by-bit basis. If any matching pattern, or codeword, has been found, then the LUT 124 outputs decoded symbol DC and code length CL associated with the codeword. The LUT 124 is implementable as a ROM (read-only memory) or a logic circuit, for example.

The code length CL (from 1 through 16), output from the LUT 124, is input to the barrel shifter 121 as the shift input value. The barrel shifter 121 combines the outputs of the barrel shifter register 122 and barrel shifter 111 with each other as the upper and lower 16-bit sub-sequences, respectively, to obtain a 32-bit data sequence. Then, using the shift input value (i.e., the code length CL) as a shift length SH2 (from 1 through 16), the barrel shifter 121 selects 16 bits from the 32-bit combined data sequence and then outputs the 16-bit data sequence as a shift result. The 16 bits selected are the $(SH2+1)^{th}$ through $(SH2+16)^{th}$ bits of the 32-bit data sequence. It should be noted that the "first bit" herein means the MSB of the 32-bit combined data sequence. Accordingly, the barrel shifter 121 selects a contiguous data sequence with a length of 16 bits (=N bits) from another contiguous data sequence with a length of 32bits (=2N bits) in a bit stream so that the 16-bit data sequence selected starts from an $(L+1)^{th}$ bit position as determined in accordance with the shift input value L. Then, the barrel shifter 121 writes the shift result on the barrel shifter register 122.

The adder 114 adds together the code length CL (from 1 through 16) output from the LUT 124 and the remainder RM (from 0 through 15) output from the accumulation register 115 to obtain and output the sum SM. The adder 114 outputs the carry signal CR of the sum SM to the buffer 101 and input register 112, and writes the remainder RM (from 0 through 15) thereof on the accumulation register 115.

The carry signal CR is a signal which is "1" if the sum SM is from 16 through 31 (the quotient obtained by dividing the sum SM by the maximum code length "16"). The remainder RM is obtained when the sum SM is divided by the maximum code length "16" (the remainder of the sum SM modulo 16 (i.e., the maximum code length)). Therefore, the remainder RM is equal to a remainder obtained by dividing the sum of the code lengths of the decoded codewords by the maximum code length.

More specifically, the MSB of the 5-bit sum SM, obtained by adding together the 5-bit code length CL and the 4-bit remainder RM output from the accumulation register 115, is the carry signal CR, and the remaining 4 bits is the new remainder RM of the sum SM modulo 16.

FIG. 3 illustrates exemplary cycle-by-cycle data flows in the VLC decoder shown in FIG. 1. The input bit stream is herein a series of codewords as illustrated in FIG. 2.

Referring to FIG. 3, the initial conditions are set as follows to set initial-state data for the registers. Specifically, "1", "16" and "16" are used as the carry signal CR for cycles 0 through 1, the shift length SH1 of the barrel shifter 111 for cycles 0 through 1, and the shift length SH2 of the barrel shifter 121 for cycle 0, respectively. Also, the buffer 101 delivers an output in cycle 0, and the output of the accumulation register 115 for cycles 0 through 1 is "15". In FIGS. 3, 7 and 12, "x" indicates that it may be any data. The operation of the VLC decoder shown in FIG. 1 will now be described with reference to FIG. 3.

Cycle 0

Based on the initial conditions, the output of the buffer 101 is a1–a8b1–b6c1–c2. In accordance with the initial shift length SH1 "16" of the barrel shifter 111 and the initial shift length SH2 "16" of the barrel shifter 121, the output of the barrel shifter 111 is a1–a8b1–b6c1–c2, and the output of the barrel shifter 121 is also a1–a8b1–b6c1–c2. And the carry signal CR is "1" on the initial conditions.

Cycle 1

In accordance with the carry signal CR "1" in cycle 0, the input register 112 latches the output a1–a8b1–b6c1–c2 of the buffer 101, and the output of the buffer 101 becomes c3–c5d1–d13.

The barrel shifter register 122 latches a1–a8b1–b6c1–c2 output from the barrel shifter 121. In accordance with the initial shift length SH1 "16" of the barrel shifter 111, the barrel shifter 111 outputs c3–c5d1–d13. In accordance with the output a1–a8b1–b6c1–c2 of the barrel shifter register 122, the decoded symbol output from the LUT 124 is "A", and the code length CL output from the LUT 124 is "8". In accordance with the code length CL "8", 0the barrel shifter 121 outputs b1–b6c1–c5d1–d5.

Based on the initial conditions, the adder 114 outputs the sum SM "23", which is obtained by adding together the code length CL "8" and the output "15" of the accumulation register 115. The carry signal CR is "1" and the remainder RM is "7".

Cycle 2

In accordance with the carry signal CR "1" in cycle 1, the input register 112 latches the output c3–c5d1–d13 of the buffer 101, and the output of the buffer 101 becomes d14–d15e1–e12f1–f2.

The barrel shifter register 122 latches b1–b6c1–c5d1–d5 output from the barrel shifter 121, and the accumulation register 115 latches the remainder RM "7". In accordance with the shift length SH1 "8" of the barrel shifter 111, the barrel shifter 111 outputs d6–d15e1–e6. In accordance with the output b1–b6c1–c5d1–d5 of the barrel shifter register 122, the decoded symbol output from the LUT 124 is "B", and the code length CL output from the LUT 124 is "6". In accordance with the code length CL "6", the barrel shifter 121 outputs c1–c5d1–d11.

The adder 114 outputs the sum SM "13", which is obtained by adding together the code length CL "6" and the output "7" of the accumulation register 115. The carry signal CR is "0" and the remainder RM is "13".

Cycle 3

In cycle 3, the input register 112 and the output of the buffer 101 are not updated in accordance with the carry signal CR "0" obtained in cycle 2.

The barrel shifter register 122 latches c1–c5d1–d11 output from the barrel shifter 121, and the accumulation register 115 latches the remainder RM "13". In accordance with the shift length SH1 "14" of the barrel shifter 111, the barrel shifter 111 outputs d12–d15e1–e12. In accordance with the output c1–c5d1–d11 of the barrel shifter register 122, the decoded symbol output from the LUT 124 is "C", and the code length CL output from the LUT 124 is "5".

In accordance with the code length CL "5", the barrel shifter 121 outputs d1–d15e1. The adder 114 outputs the sum SM "18", which is obtained by adding together the code length "5" and the output "13" of the accumulation register 115. The carry signal CR is "1" and the remainder RM is "2".

In the next cycle 4, in accordance with the carry signal CR "1" obtained in cycle 3, the input register 112 latches d14–d15e1–e12f1–f2, and the output of the buffer 101 becomes f3–f10g1–g8.

Thereafter, the VLC decoder shown in FIG. 1 operates as in cycle 2 and cycle 3. Note that the buffer output and the input register are updated if the carry signal CR obtained in the preceding cycle is "1", but not updated if the carry signal CR is "0".

In this way, a variable-length decoded symbol can be output each cycle from cycle 1 on. Particularly, at the beginning of the decoding operation, the first decoded output is obtained in cycle 1, i.e., one cycle after cycle 0 in which the input buffer 101 outputs data for the first time.

Figure 11:
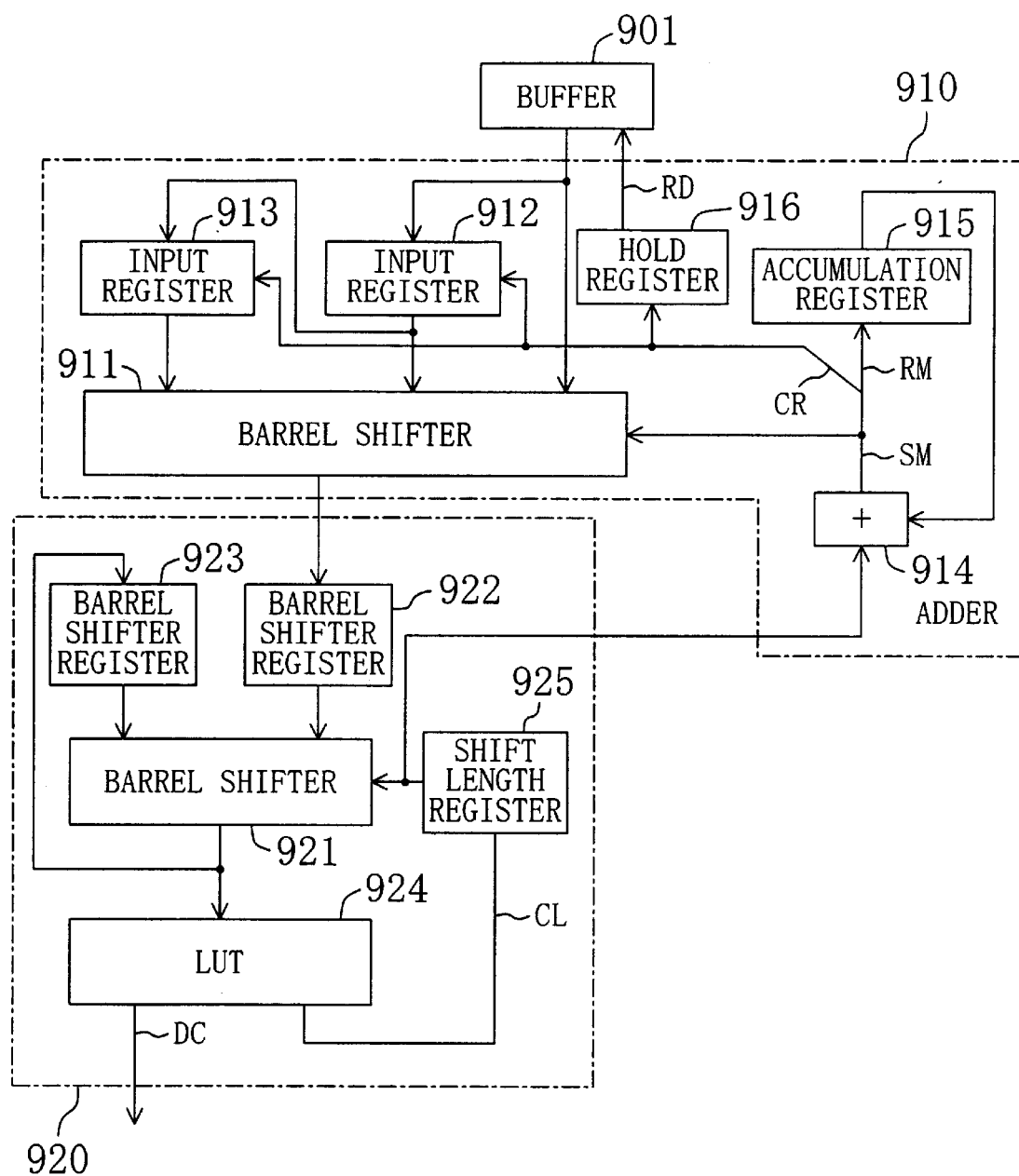
FIG. 11 is a block diagram illustrating a known VLC decoder.

As described above, according to the first embodiment as compared to the known decoder shown in FIG. 11, the number of 16-bit input registers required can be reduced from two to one. In addition, the decoder needs a 32-bit-input, 16-bit-output barrel shifter instead of the 48-bit-input, 16-bit-output barrel shifter. Moreover, at the beginning of a decoding operation, the number of cycles it takes to obtain a decoded output after the input buffer has output data can also be reduced from two to one.

Moreover, while the conventional decoder shown in FIG. 11 needs two barrel shifter registers and one shift length register, the decoder of the first embodiment needs just one barrel shifter register instead of these three registers, thus reducing the number of registers required.

Modified Example of Embodiment 1

Figure 4:
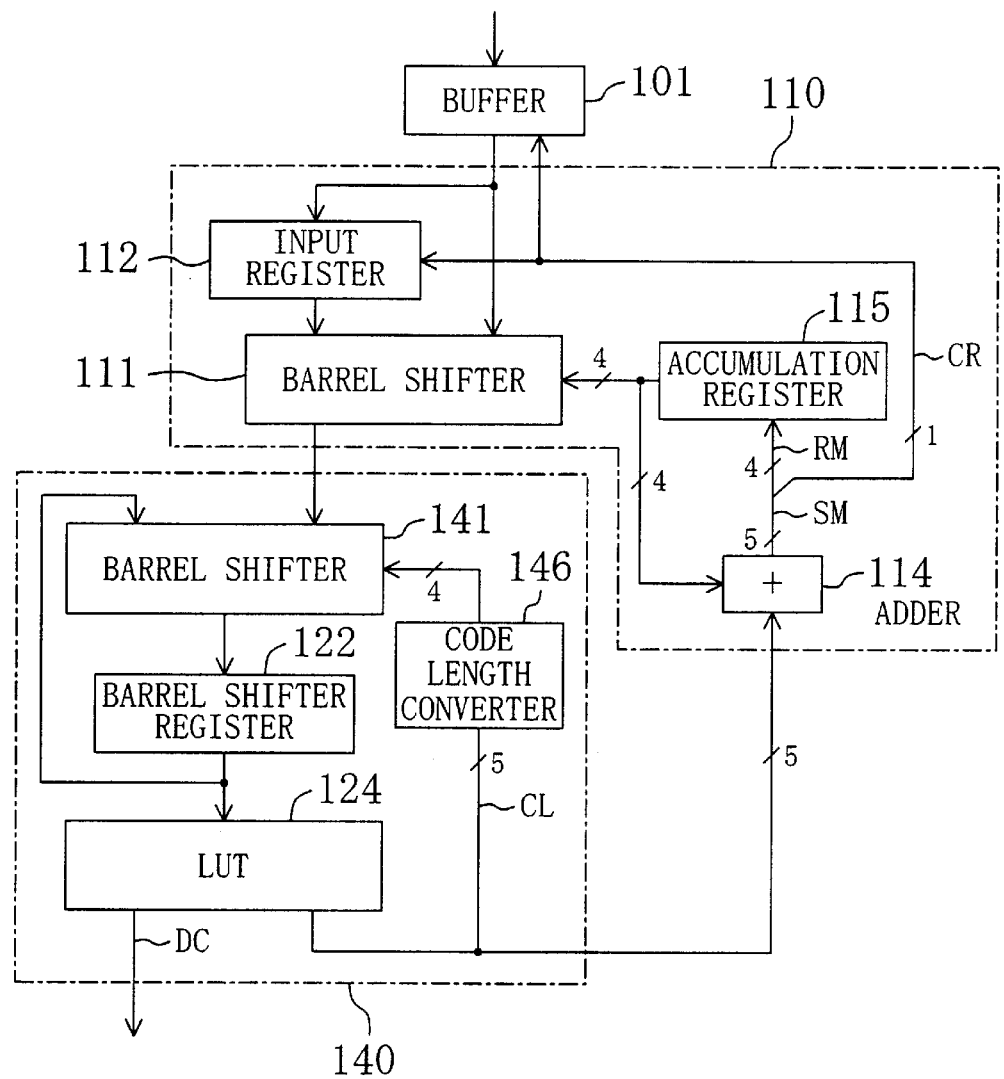
FIG. 4 is a block diagram illustrating a VLC decoder according to a modified example of the first embodiment.

FIG. 4 is a block diagram illustrating a VLC decoder according to a modified example of the first embodiment. Unlike the VLC decoder shown in FIG. 1, the VLC decoder shown in FIG. 4 includes a decoding section 140 instead of the decoding section 120. The decoding section 140 is similar to the decoding section 120 except that the section 140 includes a barrel shifter 141 instead of the barrel shifter 121. Moreover, the decoding section 140 further includes a code length converter 146 which receives the code length CL and outputs, to the barrel shifter 141, a value obtained by converting the code length CL instead of the code length CL itself. The other components are the same as those already described with reference to FIG. 1, and the description thereof will be omitted herein.

Figure 5:
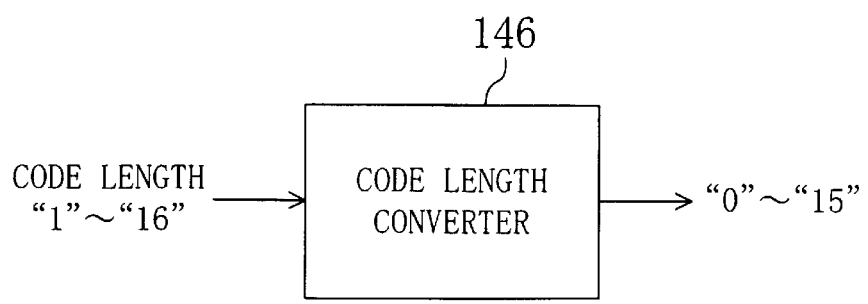
FIG. 5 illustrates a code length converter.

FIG. 5 illustrates the code length converter 146. The code length converter 146 receives the 5-bit code length CL (from 1 through 16) output from the LUT 124, and outputs a value (from 0 through 15) obtained by subtracting one therefrom. Specifically, the code length converter 146 is implementable as a circuit, like a ROM, capable of subtracting the value "1".

The barrel shifter 141 receives a 4-bit value (from 0 through 15), output from the code length converter 146, as its shift input, and performs a bit shift operation using the sum of the shift input value and one as a shift length, thereby outputting a shift result. Accordingly, the barrel shifter 141 selects a contiguous data sequence with a length of 16 bits (=N bits) from another contiguous data sequence with a length of 32 bits (=2N bits) in a bit stream so that the 16-bit data sequence selected starts from an $(L+2)^{th}$ bit position as determined in accordance with the shift input value L. Then, the barrel shifter 141 writes the shift result on the barrel shifter register 122.

Each of the barrel shifters 111 and 141 receives a 4-bit value as its shift input and is capable of performing 16 different types of bit shift operations. The barrel shifters 111 and 141 may have the same configuration. Therefore, compared to the decoder shown in FIG. 1, the decoder shown in FIG. 4 can be laid out as a more symmetrical pattern and occupies a smaller chip area.

Embodiment 2

Figure 6:
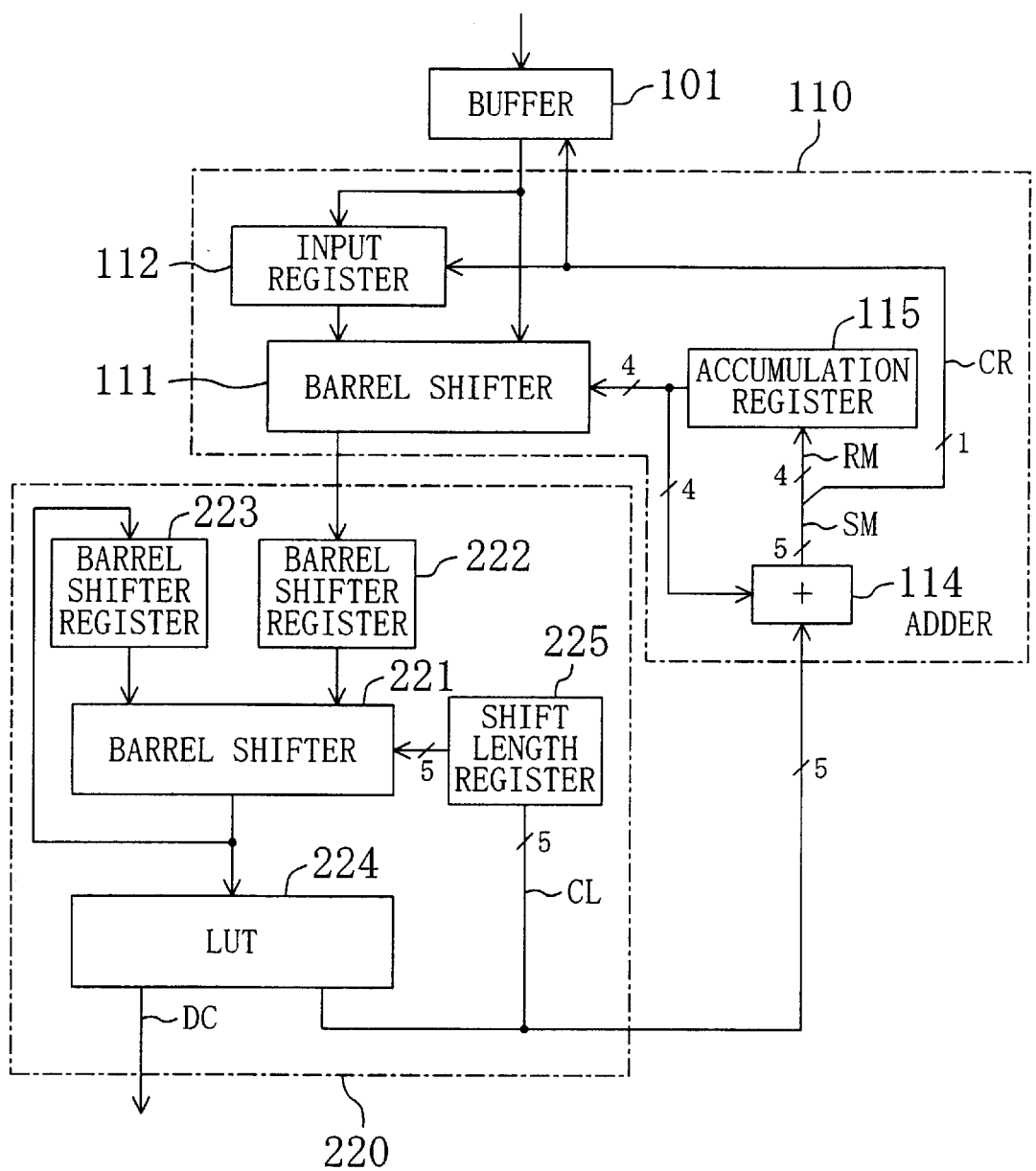
FIG. 6 is a block diagram illustrating a VLC decoder according to a second embodiment of the present invention.

FIG. 6 is a block diagram illustrating a VLC decoder according to a second embodiment of the present invention. The VLC decoder decodes variable-length codewords with a maximum code length of 16 bits. The VLC decoder shown in FIG. 6 includes the interface section 110 and a decoding section 220. The decoding section 220 includes barrel shifter 221, first and second barrel shifter registers 222 and 223, LUT 224 and shift length register 225. The buffer 101 and the interface section 110 are the same as those already described with reference to FIG. 1, and the description thereof will be omitted herein.

Each of the first and second barrel shifter registers 222 and 223 can store a data sequence of 16 bits corresponding to the maximum code length. The first barrel shifter register 222 stores 16-bit data output from the barrel shifter 111. Each of the first and second barrel shifter registers 222 and 223 outputs the stored data to the barrel shifter 221.

The barrel shifter 221 receives, as its shift input, the output (from 1 through 16) of the shift length register 225. The barrel shifter 221 combines the outputs of the second and first barrel shifter registers 223 and 222 with each other as the upper and lower 16-bit sub-sequences, respectively, to obtain a 32-bit data sequence. Then, using the shift input value as a shift length SH3 (from 1 through 16), the barrel shifter 221 selects 16 bits from the 32-bit combined data sequence and then outputs the 16-bit data sequence. The 16 bits selected are the (SH3+1)$^{th}$ through (SH3+16)$^{th}$ bits of the 32-bit data sequence. It should be noted that the "first bit" herein means the MSB of the 32-bit combined data sequence. Accordingly, the barrel shifter 221 selects a contiguous data sequence with a length of 16 bits (=N bits) from another contiguous data sequence with a length of 32 bits (=2N bits) in a bit stream so that the 16-bit data sequence selected starts from an (L+1)$^{th}$ bit position as determined in accordance with the shift input value L. The barrel shifter 221 writes this shift result on the second barrel shifter register 223 and also outputs the shift result to the LUT 224.

The LUT 224 decodes the output of the barrel shifter 221, outputs the decoded symbol DC, and writes the code length CL (from 1 through 16) of the decoded codeword on the shift length register 225 while outputting the code length CL to the adder 114. The LUT 224 is a table storing a decoded symbol and a code length for each of the variable-length codewords. The LUT 224 is similar to the LUT 124 shown in FIG. 1.

FIG. 7 illustrates exemplary cycle-by-cycle data flows in the VLC decoder shown in FIG. 6. As in the first embodiment, the input bit stream is herein a series of codewords combined as illustrated in FIG. 2.

Referring to FIG. 7, the initial conditions are set as follows to set initial-state data for the registers. That is, "1","16" and "16" are used as the carry signal CR for cycles 0 through 1, the shift length SH1 of the barrel shifter 111 for cycles 0 through 1, and the shift length SH3 of the barrel shifter 221 for cycle 1, respectively. Moreover, the buffer 101 supplies an output in cycle 0, and the output of the accumulation register 115 in cycles 0 through 1 is "15". The operation of the VLC decoder shown in FIG. 6 will now be described with reference to FIG. 7.

Cycle 0

Based on the initial conditions, the output of the buffer 101 is a1–a8b1–b6c1–c2. In accordance with the initial shift length SH1 "16" of the barrel shifter 111, the output of the barrel shifter 111 is a1–a8b1–b6c1–c2. The carry signal CR is "1" on the initial conditions.

Cycle 1

In accordance with the carry signal CR "1" in cycle 0, the input register 112 latches the output a1–a8b1–b6c1–c2 of the buffer 101, and the output of the buffer 101 becomes c3–c5d1–d13.

The first barrel shifter register 222 latches a1–a8b1–b6c1–c2 output from the barrel shifter 111. In accordance with the initial shift length SH1 "16" of the barrel shifter 111, the barrel shifter 111 outputs c3–c5d1–d13. In accordance with the initial shift length SH3 "16" of the barrel shifter 221, the barrel shifter 221 outputs a1–a8b1–b6c1–c2. In accordance with the output a1–a8b1–b6c1–c2 of the barrel shifter 221, the decoded symbol output from the LUT 224 is "A", and the code length CL output from the LUT 224 is "8".

Based on the initial conditions, the adder 114 outputs the sum SM "23", which is obtained by adding together the code length CL "8" and the output "15" of the accumulation register 115. The carry signal CR is "1" and the remainder RM is "7".

Cycle 2

In accordance with the carry signal CR "1" in cycle 1, the input register 112 latches the output c3–c5d1–d13 of the buffer 101, and the output of the buffer 101 becomes d14–d15e1–e12f1–f2.

The first barrel shifter register 222 latches c3–c5d1–d13 output from the barrel shifter 111, and the second barrel shifter register 223 latches a1–a8b1–b6c1–c2 output from the barrel shifter 221. The shift length register 225 latches the code length CL "8", and the accumulation register 115 latches the remainder RM "7".

In accordance with the shift length SH1 "8" of the barrel shifter 111, the barrel shifter 111 outputs d6–d15e1–e6. In accordance with the shift length SH3 "8" output from the shift length register 225, the barrel shifter 221 outputs b1–b6c1–c5d1–d5. In accordance with the output b1–b6c1–c5d1–d5 of the barrel shifter 221, the decoded symbol output from the LUT 224 is "8", and the code length CL output from the LUT 224 is "6".

The adder 114 outputs the sum SM "13", which is obtained by adding together the code length CL "6" and the output "7" of the accumulation register 115. The carry signal CR is "0" and the remainder RM is "13".

Cycle 3

In cycle 3, the input register 112 and the output of the buffer 101 are not updated in accordance with the carry signal CR "0" obtained in cycle 2.

The first barrel shifter register 222 latches d6–d15e1–e6 output from the barrel shifter 111, and the second barrel shifter register 223 latches b1–6c1–c5d1–d5 output from the barrel shifter 221. The shift length register 225 latches the code length CL "6", and the accumulation register 115 latches the remainder RM "13".

In accordance with the shift length SH1 "14" of the barrel shifter 111, the barrel shifter 111 outputs d12–d15e1–e12. In accordance with the shift length SH3 "6" output from the shift length register 225, the barrel shifter 221 outputs c1–c5d1–d11. In accordance with c1–c5d1–d11 output from the barrel shifter 221, the decoded symbol output from the LUT 224 is "C", and the code length CL output from the LUT 224 is "5".

The adder 114 outputs the sum SM "18" obtained by adding together the code length CL "5" and the output "13" of the accumulation register 115. Accordingly, the carry signal CR is "1" and the remainder RM is "2".

In the next cycle 4, in accordance with the carry signal CR "1" obtained in cycle 3, the input register 112 latches d14–d15e1–e12f1–f2, and the output of the buffer 101 becomes f3–f10f1–f8.

Thereafter, the VLC decoder shown in FIG. 6 operates as in cycles 2 and 3. It should be noted that the buffer output and the input register are updated if the carry signal CR obtained in the previous cycle is "1", but not updated if it is "0".

In this way, a variable-length decoded symbol can be output every cycle from cycle 1 on. Particularly, at the beginning of the decoding operation, the first decoded output is obtained in cycle 1, i.e., one cycle after cycle 0 in which the buffer 101 outputs data for the first time.

Modified Example of Embodiment 2

Figure 8:
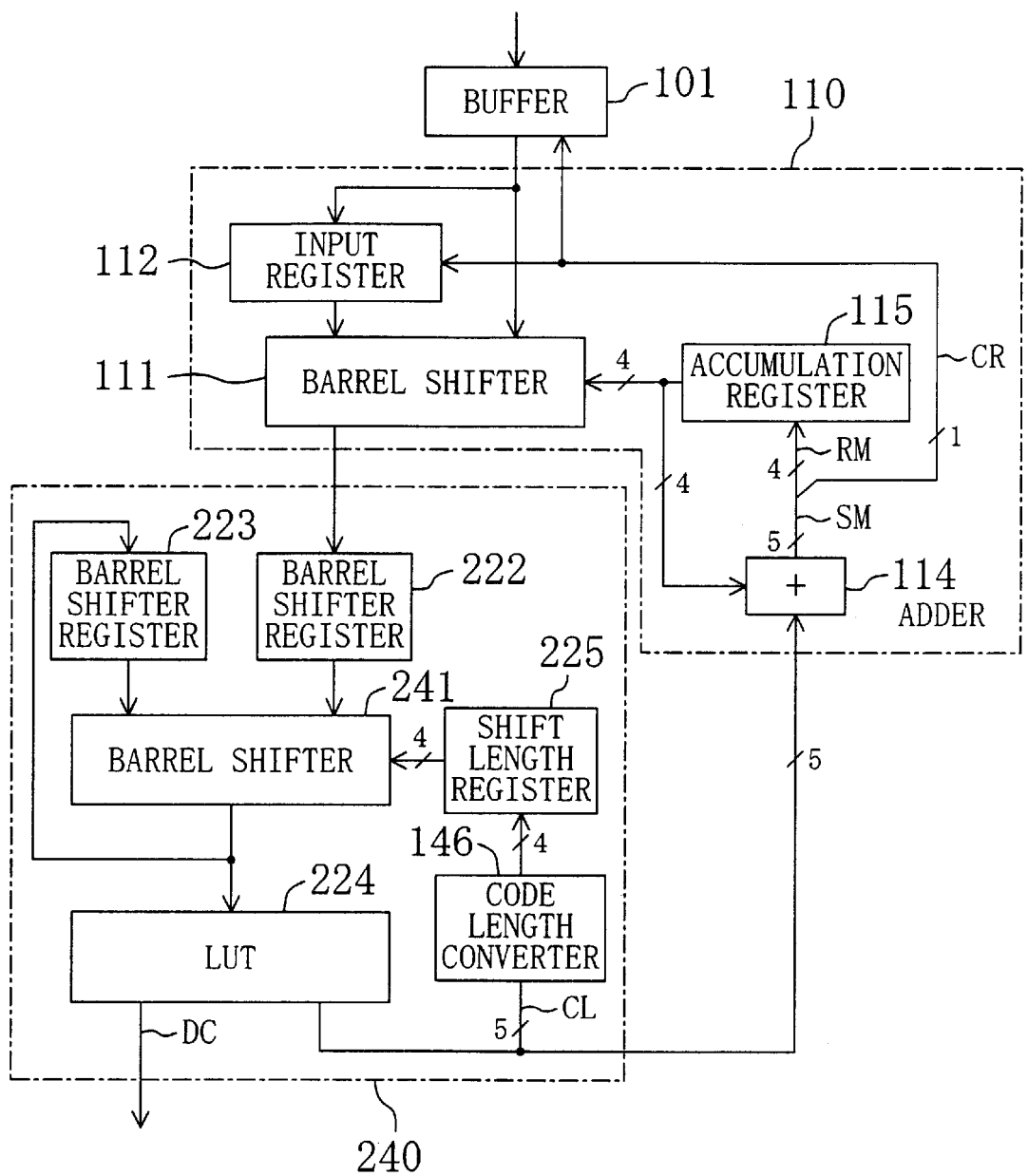
FIG. 8 is a block diagram illustrating a VLC decoder according to a modified example of the second embodiment.

FIG. 8 is a block diagram illustrating a VLC decoder according to a modified example of the second embodiment. The VLC decoder shown in FIG. 8 is similar to the VLC decoder shown in FIG. 6 except that the decoder shown in FIG. 8 includes a decoding section 240 instead of the decoding section 220. The decoding section 240 is similar to the decoding section 220 except that the section 240 includes a barrel shifter 241 instead of the barrel shifter 221. Moreover, the decoding section 240 further includes the code length converter 146, which receives the code length CL and outputs not the code length CL, but a value obtained by converting the code length CL, to the shift length register 225. The other components are the same as those already described with reference to FIG. 6, and the code length converter 146 is the same as that described with reference to FIG. 5. Thus, the description thereof will be omitted herein.

The barrel shifter 241 receives, as its shift input, a 4-bit value (from 0 through 15), which has been produced by the code length converter 146 by converting the code length CL, and performs a bit shift operation using the sum of the shift input and one as a shift length, thereby outputting the shift result. Accordingly, the barrel shifter 241 selects a contiguous data sequence with a length of 16 bits (=N bits) from another contiguous data sequence with a length of 32 bits (=2N bits) in a bit stream so that the 16-bit data sequence selected starts from an $(L+2)^{th}$ bit position as determined in accordance with the shift input value L.

Each of the barrel shifters 111 and 241 receives a 4-bit value as its shift input and is capable of performing 16 different types of bit shift operations. The barrel shifters 111 and 241 may have the same configuration. Therefore, compared to the decoder shown in FIG. 6, the decoder shown in FIG. 8 can be laid out as a more symmetrical pattern and occupies a smaller chip area.

In the decoder shown in FIG. 8, the code length CL is output to the code length converter 146 and the output of the code length converter 146 is provided to the shift length register 225. Alternatively, the code length converter 146 may be provided between the shift length register 225 and the barrel shifter 241.

Embodiment 3

Figure 9:
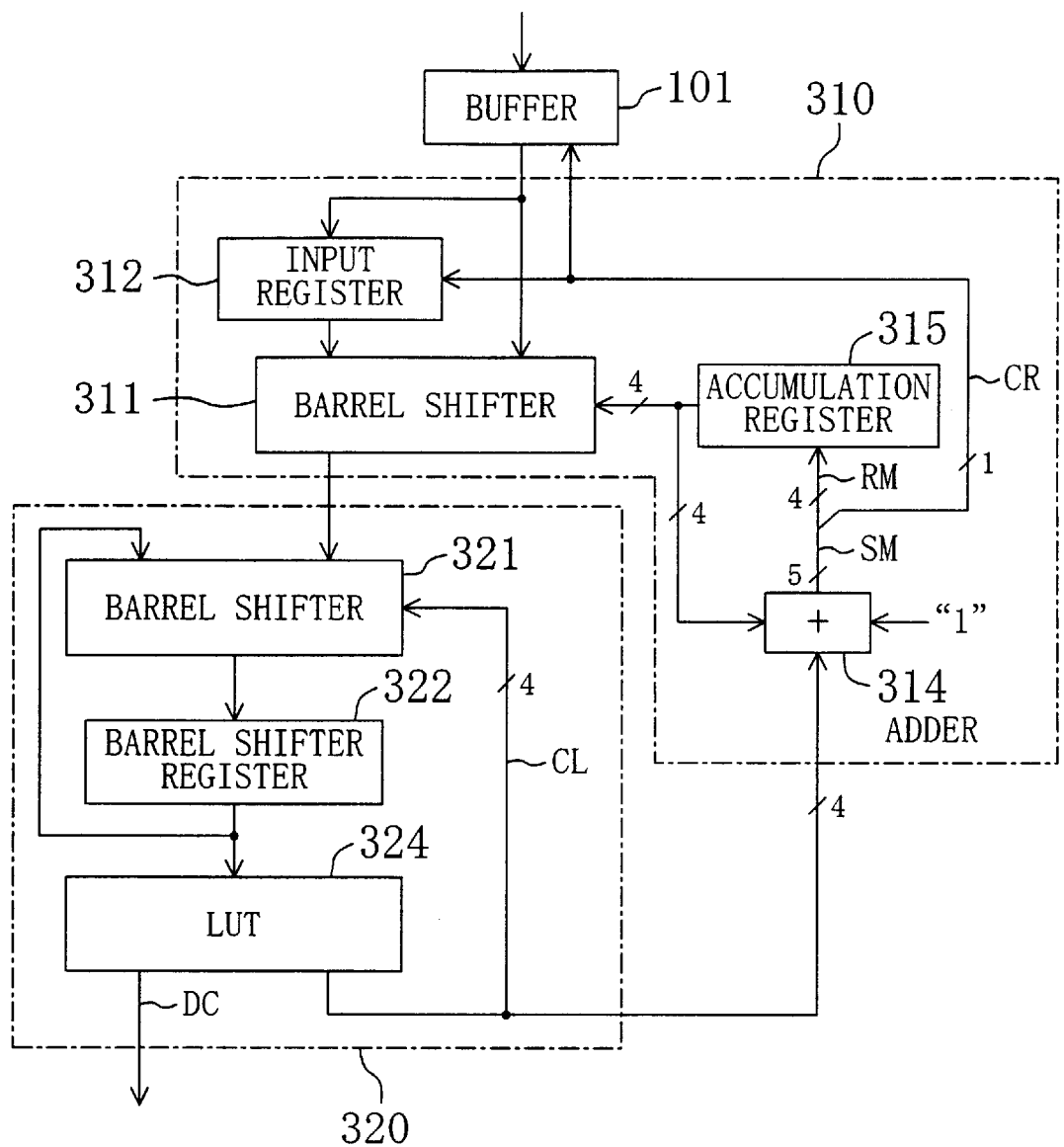
FIG. 9 is a block diagram illustrating a VLC decoder according to a third embodiment of the present invention.

FIG. 9 is a block diagram illustrating a VLC decoder according to a third embodiment of the present invention. The VLC decoder shown in FIG. 9 includes an interface section 310 and a decoding section 320. The interface section 310 includes barrel shifter 311, input register 312, adder 314 and accumulation register 315. The decoding section 320 includes barrel shifter 321, barrel shifter register 322, and lookup table 324.

The VLC decoder shown in FIG. 9 is similar to the VLC decoder shown in FIG. 1 except that the decoder shown in FIG. 9 includes the adder 314, barrel shifter 321 and LUT 324 instead of the adder 114, barrel shifter 121 and LUT 124, respectively. The VLC decoder shown in FIG. 9 is characterized by representing the actual code length (from 1 through 16) of a decoded codeword as a value (from 0 through 15) obtained by subtracting one therefrom.

As shown in FIG. 9, a bit stream and a carry signal CR, which is output from the adder 314, are input to a buffer 101. The input register 312 accommodates a data sequence of 16 bits corresponding to the maximum code length, and latches the 16-bit input data, output from the buffer 101, in the next cycle if the carry signal CR is "1".

The buffer 101 stores the input bit stream thereon and outputs the stored bit stream to the barrel shifter 311 and the input register 312 on a 16-bit basis in the next cycle if the carry signal CR is "1". The buffer 101 holds its output for one cycle.

The remainder RM (from 0 through 15), output from the accumulation register 315, is input to the barrel shifter 311 as a shift input value. The barrel shifter 311 combines the outputs of the input register 312 and buffer 101 with each other as the upper and lower 16-bit sub-sequences, respectively, to obtain a 32-bit data sequence. Then, using the sum of the shift input value and one as a shift length SH4 (from 1 through 16), the barrel shifter 311 selects 16 bits from the 32-bit combined data sequence and then outputs the 16-bit data sequence to the barrel shifter 321. The 16 bits selected are the $(SH4+1)^{th}$ through $(SH4+16)^{th}$ bits of the 32-bit data sequence. It should be noted that the "first bit" herein means the MSB of the 32-bit combined data sequence.

The barrel shifter register 322 accommodates a data sequence of 16 bits corresponding to the maximum code length, and outputs the data stored to the barrel shifter 321 and LUT 324.

The LUT 324 decodes the output of the barrel shifter register 322, thereby outputting a decoded symbol DC and a value, obtained by subtracting one from the actual code length of the decoded codeword, as the code length CL (from 1 through 15) to the barrel shifter 321 and adder 314. The LUT 324 is a table so compiled as to store a decoded symbol and code length minus one for each variable-length codeword. The LUT 324 is the same as the LUT 124 shown in FIG. 1 except that the LUT 324 outputs a number obtained by subtracting one from the actual code length.

The code length CL (from 0 through 15), output from the LUT 324, is input to the barrel shifter 321 as the shift input value. The barrel shifter 321 combines the outputs of the barrel shifter register 322 and barrel shifter 311 with each other as the upper and lower 16-bit sub-sequences, respectively, to obtain a 32-bit data sequence. Then, using the sum of the shift input value (i.e., the code length CL) and one as a shift length SH5 (from 1 through 16), the barrel shifter 321 selects 16 bits from the 32-bit combined data sequence and then outputs the 16-bit data sequence as a shift result. The 16 bits selected are the $(SH5+1)^{th}$ through $(SH5+16)^{th}$ bits of the 32-bit data sequence. It should be noted that the "first bit" herein means the MSB of the 32-bit combined data sequence. Then, the barrel shifter 321 writes the shift result on the barrel shifter register 322.

The adder 314 adds together the code length CL (from 0 through 15) output from the LUT 324, the remainder RM (from 0 through 15) output from the accumulation register 315 and the constant "1" to obtain and output the sum SM. The adder 314 outputs the carry signal CR of the sum SM to the buffer 101 and input register 312, and writes the remainder RM (from 0 through 15) thereof on the accumulation register 315.

More specifically, the MSB of the 5-bit sum SM, obtained by adding together the 4-bit code length CL, the 4-bit remainder RM output from the accumulation register 315, and the constant "1", is the carry signal CR, and the remaining 4 bits is the new remainder RM of the sum SM modulo 16.

As described above, in the VLC decoder shown in FIG. 9, the LUT 324 outputs, as a code length, a value obtained by subtracting one from the code length of a decoded codeword. Thus, the LUT 324 outputs values "0" to "15" as the code length CL for the codewords with various code lengths ranging from "1" to "16". When a value from 0 through 15 is input as a shift length to the barrel shifter 321, the barrel shifter s 321 performs a bit shift operation using, as the shift length, a value from 1 through 16 obtained by adding 1 to the input value. Moreover, the adder 314 adds together the code length (from 0 through 15) output from the LUT 324, the output (from 0 through 15) of the accumulation register 315 and the constant "1". In the other respects, the operation of the VLC decoder shown in FIG. 9 is similar to that already described for the first embodiment with reference to FIG. 3, and the description thereof will be omitted herein.

In the VLC decoder FIG. 9 having such a configuration, each of the barrel shifters 311 and 321 receives a 4-bit value (from 0 through 15) as its shift input and is capable of performing 16 different types of bit shift operations. And the barrel shifters 311 and 321 may have the same configuration. Therefore, the decoder shown in FIG. 9 can be laid out as a more symmetrical pattern and occupies a smaller chip area. Moreover, the decoder shown in FIG. 9 does not have to include the code length converter 146 unlike the counterpart shown in FIG. 4.

Embodiment 4

Figure 10:
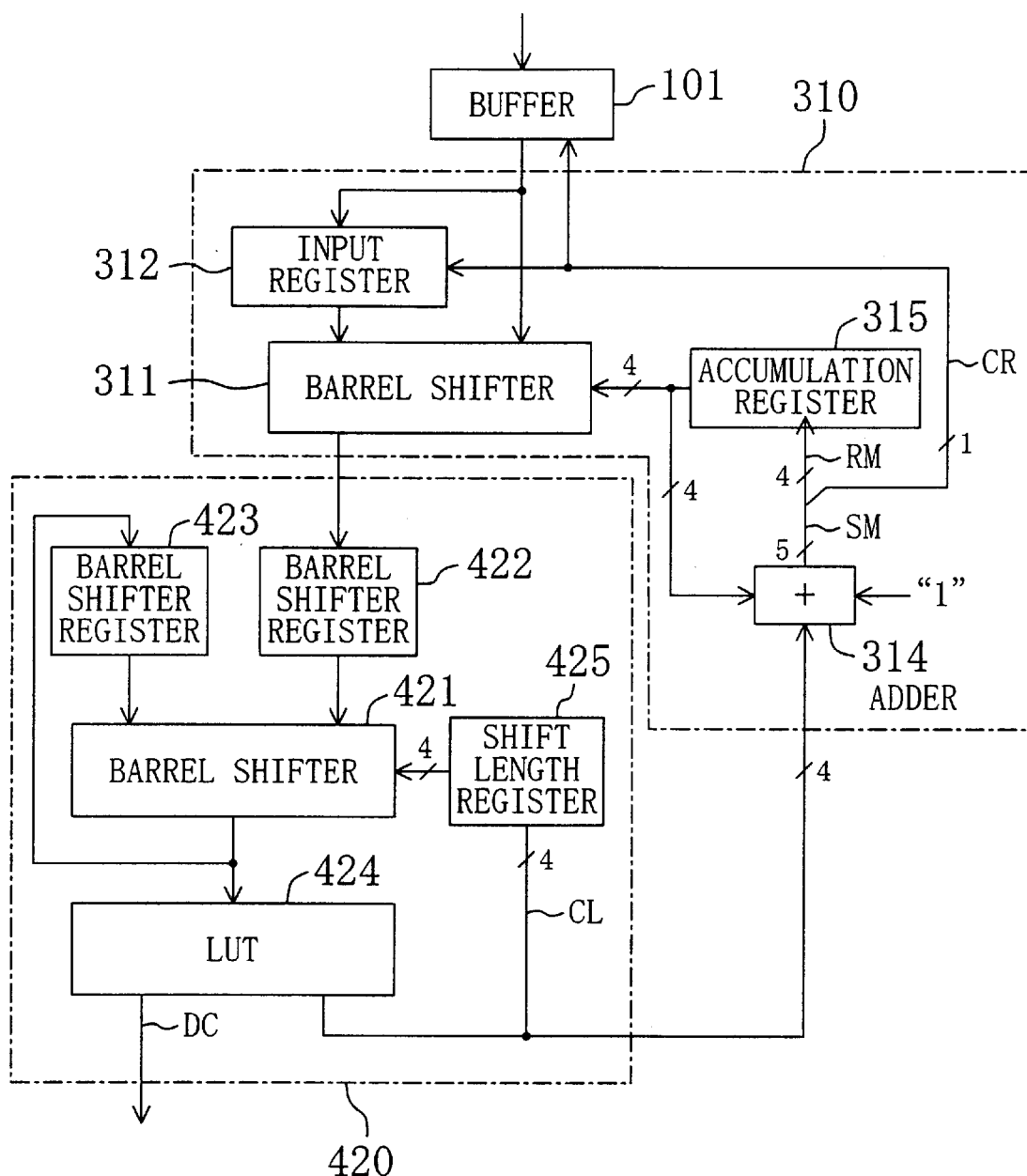
FIG. 10 is a block diagram illustrating a VLC decoder according to a fourth embodiment of the present invention.

FIG. 10 is a block diagram illustrating a VLC decoder according to a fourth embodiment of the present invention. The VLC decoder shown in FIG. 10 includes the interface section 310 and a decoding section 420. The decoding section 420 includes barrel shifter 421, first and second barrel shifter registers 422 and 423, LUT 424 and shift length register 425. The buffer 101 and the interface section 310 are the same as those already described with reference to FIG. 9, and the description thereof will be omitted herein.

The VLC decoder shown in FIG. 10 is similar to the VLC decoder shown in FIG. 6 except that the decoder shown in FIG. includes the adder 314, barrel shifter 421 and LUT 424 instead of the adder 114, barrel shifter 221 and LUT 224, respectively. As in the decoder shown in FIG. 9, the VLC decoder shown in FIG. 10 is characterized by representing the actual code length (from 1 through 16) of a decoded codeword as a value (from 0 through 15) obtained by subtracting 1 therefrom.

Each of the first and second barrel shifter registers 422 and 423 can store a data sequence of 16 bits corresponding to the maximum code length. The first barrel shifter register 422 stores 16-bit data output from the barrel shifter 311. Each of the first and second barrel shifter registers 422 and 423 outputs the stored data to the barrel shifter 421.

The output (from 0 through 15) of the shift length register 425 is input to the barrel shifter 421 as a shift input value. The barrel shifter 421 combines the outputs of the second and first barrel shifter registers 423 and 422 with each other as the upper and lower 16-bit sub-sequences, respectively, to obtain a 32-bit data sequence. Then, using the sum of the shift input value and one as a shift length SH6 (from 1 through 16), the barrel shifter 421 selects 16 bits from the 32-bit combined data sequence and then outputs the 16-bit data sequence as a shift result. The 16 bits selected are the $(SH6+1)^{th}$ through $(SH6+16)^{th}$ bits of the 32-bit data sequence. It should be noted that the "first bit" herein means the MSB of the 32-bit combined data sequence. The barrel shifter 421 writes the shift result on the second barrel shifter register 423, and also outputs the shift result to the LUT 424.

The LUT 424 decodes the output of the barrel shifter 421, outputs the decoded symbol DC, and writes, as the code length CL (from 0 through 15), a value obtained by subtracting 1 from the actual code length of the decoded codeword on the shift length register 425 while outputting the code length CL to the adder 314. The LUT 424 is similar to the LUT 324 shown in FIG. 9.

As described above, in the VLC decoder shown in FIG. 10, the LUT 424 outputs, as a code length, a value obtained by subtracting one from the code length of a decoded codeword. Thus, the LUT 424 outputs values "0" to "15" as the code length CL for the codewords with various code lengths ranging from "1" through "16". When a value from 0 through 15 is input as a shift length to the barrel shifter 421, the barrel shifter 421 performs a bit shift operation using, as the shift length, a value from 1 through 16 obtained by adding 1 to the input value. Moreover, the adder 314 adds together the code length (from 0 through 15) output from the LUT 424, the output (from 0 through 15) of the accumulation register 315 and the constant "1". In the other respects, the operation of the VLC decoder shown in FIG. 10 is similar to that described above for the second embodiment with reference to FIG. 7, and the description thereof will be omitted herein.

In the VLC decoder FIG. 10 having such a configuration, each of the barrel shifters 311 and 421 receives a 4-bit value (from 0 through 15) as its shift input and is capable of performing 16 different types of bit shift operations. And the barrel shifters 311 and 421 may have the same configuration. Therefore, the decoder shown in FIG. 10 can be laid out as a more symmetrical pattern and occupies a smaller chip area. Moreover, the decoder shown in FIG. 10 does not have to include the code length converter 146 unlike the counterpart shown in FIG. 8.

In the first to fourth embodiment, the width of each register is supposed to be equal to the maximum code length N for convenience sake. However, the data output from the input register of the first to fourth embodiments and the second barrel shifter register of the second and fourth embodiments is always shifted by 1 bit or more at the barrel shifter. Accordingly, the barrel shifter never outputs the MSB of the data output from these registers. Therefore, the MSB of these registers is not necessary, and thus the register width thereof may be (N−1) bits. Then, it is possible to further reduce the circuit size and circuit area. In that case, the MSB of the barrel shifter should receive no data.

Moreover, the maximum code length is supposed to be 16 in the foregoing embodiments. However, the maximum code length may be any other value. If the maximum code length is not an $n^{th}$ power of two (e.g., 16), an $n^{th}$ power of two greater than the maximum code length may be used as a provisional maximum code length. In such a case, the register widths of the input register and the barrel shifter register need to correspond to the provisional maximum code length. Moreover, the adder may output a remainder of a sum modulo the maximum code length. In such a case, the register width of the accumulation register needs to be large enough to store the remainder.

As described above, the inventive variable-length code decoder needs a smaller number of registers and a barrel shifter of a reduced size. Therefore, the decoder is implementable at a smaller circuit size and occupies a smaller chip area. In addition, at the beginning of a decoding operation, it takes a smaller number of cycles to obtain a first decoder output after a bit stream has been input.

What is claimed is:

1. A variable-length code decoder for sequentially decoding a series of variable-length codewords included in a bit stream and outputting decoded symbols corresponding to the codewords, the decoder comprising:

an interface section for accumulating various code lengths of the decoded codewords to obtain a sum, selecting a contiguous data sequence having a length of N bits (where N is a maximum code length of the variable-length codewords) from another contiguous data sequence, which has a length of 2N or 2N−1 bits and included in the bit stream, in accordance with the sum and outputting the N-bit contiguous data sequence; and a decoding section, including a lookup table, for receiving the output of the interface section and decoding a codeword included in a combination of the output and a previous output of the interface section by reference to the lookup table, thereby obtaining and outputting a decoded symbol and also outputting a code length of the decoded codeword to the interface section, wherein the interface section comprises an adder for receiving the code length of the decoded codeword directly from the lookup table and outputting the sum.

2. The decoder of claim 1, wherein the interface section further comprises an accumulation register, an input register and a barrel shifter, and wherein the accumulation register stores and outputs a remainder derived from the sum, and wherein the adder adds together the code length and the remainder, which have been output from the decoding section and the accumulation register, respectively, to obtain the sum and outputs a quotient and a remainder, which are obtained by dividing the sum by N, as a carry signal and a new remainder, respectively, and wherein the input register stores and outputs a contiguous data sequence, which has a length of N or N−1 bits and is included in the bit stream, if the carry signal is one, and wherein the barrel shifter combines the output of the input register with the following N-bit contiguous data sequence, which is included in the bit stream, so that the bits are arranged in the same order as in the bit stream, selects an N-bit contiguous data sequence from the combined data sequence using the remainder, output from the accumulation register, as a shift input value, and outputs the N-bit contiguous data sequence selected to the decoding section, the N-bit contiguous data sequence selected starting from a bit position that has been determined in accordance with the shift input value.

3. The decoder of claim 2, wherein the barrel shifter selects and outputs the N-bit contiguous data sequence, which starts from an $(M+2)^{th}$ bit (where M is the shift input value) of the combined data sequence as counted from the first bit thereof.

4. The decoder of claim 1, wherein the decoding section further comprises a barrel shifter and a barrel shifter register, and wherein the barrel shifter combines outputs of the barrel shifter register and the interface section so that the bits are arranged in the same order as in the bit stream, selects an N-bit contiguous data sequence from the combined output using the code length, output from the lookup table, as a shift input value, and then outputs the N-bit contiguous data sequence selected, the N-bit contiguous data sequence selected starting from a bit position that has been determined in accordance with the shift input value, and wherein the barrel shifter register stores and outputs the output of the barrel shifter, and wherein the lookup table outputs the decoded symbol, corresponding to the codeword included in the output of the barrel shifter register, and outputs the code length of the decoded codeword.

5. The decoder of claim 4, wherein the barrel shifter selects and outputs the N-bit contiguous data sequence, which starts from an $(L+1)^{th}$ bit (where L is the shift input value) of the combined output as counted from the first bit thereof.

6. The decoder of claim 4, wherein the decoding section further comprises a code length converter for outputting a value obtained by subtracting one from the code length, and wherein the barrel shifter selects and outputs the N-bit contiguous data sequence, which starts from an $(L+2)^{th}$ bit of the combined output as counted from the first bit thereof, by using not the code length but the output of the code length converter as the shift input value.

7. The decoder of claim 1, wherein the decoding section further comprises a barrel shifter, first and second barrel shifter registers and a shift length register, and wherein the barrel shifter combines outputs of the first and second barrel shifter registers with each other so that the bits are arranged in the same order as in the bit stream, selects an N-bit contiguous data sequence from the combined output using a value, derived from an output of the shift length register, as a shift input value, and outputs the N-bit contiguous data sequence selected, the N-bit contiguous data sequence selected starting from a bit position that has been determined in accordance with the shift input value, and wherein the first barrel shifter register stores and outputs the output of the interface section, and wherein the second barrel shifter register stores and outputs the output of the barrel shifter, and wherein the lookup table outputs the decoded symbol, corresponding to the codeword included in the output of the barrel shifter, and outputs the code length of the decoded codeword, and wherein the shift length register stores and outputs a value corresponding to the code length.

8. The decoder of claim 7, wherein the shift length register stores and outputs the code length, and wherein the barrel shifter selects and outputs the N-bit contiguous data sequence, which starts from an $(L+1)^{th}$ bit of the combined output as counted from the first bit thereof, by using the output of the shift length register as the shift input value.

9. The decoder of claim 7, wherein the decoding section further comprises a code length converter for outputting a value obtained by subtracting one from the code length, and wherein the barrel shifter selects and outputs the N-bit contiguous data sequence, which starts from an $(L+2)^{th}$ bit of the combined output as counted from the first bit thereof, by using the code-length-minus-one value, which has been input thereto by way of the code length converter and the shift length register, as the shift input value.

10. The decoder of claim 1, wherein the interface section further comprises an accumulation register, an input register and a first barrel shifter, and wherein the accumulation register stores and outputs a remainder derived from the sum, and wherein the adder adds together the code length and the remainder, which have been output from the decoding section and the accumulation register, respectively, to obtain the sum and outputs a quotient and a remainder, which are obtained by dividing the sum by N, as a carry signal and a new remainder, respectively, and wherein the input register stores and outputs a contiguous data sequence, which has a length of N bits and is included in the bit stream, if the carry signal is one, and wherein the first barrel shifter combines the output of the input register with the following N-bit contiguous data sequence, which is included in the bit stream, so that the bits are arranged in the same order as in the bit stream, selects an N-bit contiguous data sequence from the combined data sequence using the remainder, output from the accumulation register, as a shift input value, and outputs the N-bit contiguous data sequence selected to the decoding section, the N-bit contiguous data sequence selected starting from a bit position that has been determined in accordance with the shift input value, and wherein the decoding section further comprises a second barrel shifter and a barrel shifter register, and wherein the second barrel shifter combines outputs of the barrel shifter register and the interface section so that the bits are arranged in the same order as in the bit stream, selects an N-bit contiguous data sequence from the combined output using the code length, output from the lookup table, as a shift input value, and then outputs the N-bit contiguous data sequence selected, the N-bit contiguous data sequence selected starting from a bit position that has been determined in accordance with the shift input value, and wherein the barrel shifter register stores and outputs the output of the second barrel shifter, and wherein the lookup table outputs the decoded symbol, corresponding to the codeword included in the output of the barrel shifter register, and outputs the code length of the decoded codeword.

11. The decoder of claim 1, wherein the interface section further comprises an accumulation register, an input register and a first barrel shifter, and wherein the accumulation register stores and outputs a remainder derived from the sum, and wherein the adder adds together the code length and the remainder, which have been output from the decoding section and the accumulation register, respectively, to obtain the sum and outputs a quotient and a remainder, which are obtained by dividing the sum by N, as a carry signal and a new remainder, respectively, and wherein the input register stores and outputs a contiguous data sequence, which has a length of N bits and is included in the bit stream, if the carry signal is one, and wherein the first barrel shifter combines the output of the input register with the following N-bit contiguous data sequence, which is included in the bit stream, so that the bits are arranged in the same order as in the bit stream, selects an N-bit contiguous data sequence from the combined data sequence using the remainder, output from the accumulation register, as a shift input value, and outputs the N-bit contiguous data sequence selected to the decoding section, the N-bit contiguous data sequence selected starting from a bit position that has been determined in accordance with the shift input value, and wherein the decoding section further comprises a second barrel shifter, first and second barrel shifter registers and a shift length register, and wherein the second barrel shifter combines outputs of the first and second barrel shifter registers with each other so that the bits are arranged in the same order as in the bit stream, selects an N-bit contiguous data sequence from the combined output using a value, derived from an output of the shift length register, as a shift input value, and outputs the N-bit contiguous data sequence selected, the N-bit contiguous data sequence selected starting from a bit position that has been determined in accordance with the shift input value, and wherein the first barrel shifter register stores and outputs the output of the interface section, and wherein the second barrel shifter register stores and outputs the output of the second barrel shifter, and wherein the lookup table outputs the decoded symbol, corresponding to the codeword included in the output of the second barrel shifter, and outputs the code length of the decoded codeword, and wherein the shift length register stores and outputs a value corresponding to the code length.

12. The decoder of claim 10 or 11, wherein the adder obtains the sum by adding one to the sum of the code length and the remainder that have been output from the decoding section and the accumulation register, respectively, and wherein the lookup table outputs, as the code length, a value obtained by subtracting one from the code length of the codeword.

* * * * *